(12) United States Patent
Svensson

(10) Patent No.: US 12,147,168 B2
(45) Date of Patent: Nov. 19, 2024

(54) OFFSET ALIGNMENT METHOD AND MICRO-LITHOGRAPHIC PRINTING DEVICE

(71) Applicant: Mycronic AB, Taby (SE)

(72) Inventor: Anders Svensson, Sollentuna (SE)

(73) Assignee: Mycronic AB, Taby (SE)

( * ) Notice: Subject to any disclaimer, the term of this patent is extended or adjusted under 35 U.S.C. 154(b) by 118 days.

(21) Appl. No.: 17/997,843

(22) PCT Filed: May 12, 2021

(86) PCT No.: PCT/EP2021/062682
§ 371 (c)(1),
(2) Date: Nov. 3, 2022

(87) PCT Pub. No.: WO2021/254698
PCT Pub. Date: Dec. 23, 2021

(65) Prior Publication Data
US 2023/0341788 A1    Oct. 26, 2023

(30) Foreign Application Priority Data
Jun. 17, 2020 (EP) .................................... 20180453

(51) Int. Cl.
*G03F 9/00* (2006.01)
*G03F 7/00* (2006.01)

(52) U.S. Cl.
CPC .......... *G03F 9/7088* (2013.01); *G03F 9/7069* (2013.01); *G03F 7/70383* (2013.01); *G03F 9/7019* (2013.01)

(58) Field of Classification Search
CPC .. G03F 7/70383; G03F 9/7019; G03F 9/7069; G03F 9/7088
See application file for complete search history.

(56) References Cited

U.S. PATENT DOCUMENTS 5,477,057 A    12/1995  Angeley et al.
9,588,413 B2   3/2017   Kim et al.
(Continued)

FOREIGN PATENT DOCUMENTS

CN    102207689 A    10/2011
TW    201915598 A    4/2019
(Continued)

OTHER PUBLICATIONS

European Notice of Intention to Grant dated Dec. 14, 2023 for corresponding European Patent Application No. 21726084.3.
(Continued)

*Primary Examiner* — Peter B Kim
(74) *Attorney, Agent, or Firm* — Harness, Dickey & Pierce, P.L.C.

(57) ABSTRACT

An offset alignment method for a micro-lithographic printing device comprises placing (S10) of an alignment target substrate. A target pattern presents areas of at least two different light reflectivities is defined relative an origin point. The alignment target substrate is illuminated (S20). Reflected light is measured (S30). A reflection image of the target pattern is created (S40) by the measured light. The illumination is made according to a test pattern of light, having areas with and without illumination. The test pattern is defined relative an origin point. A measured target pattern origin point is determined (S50) from target pattern associated features in the reflection image and a measured test pattern origin point is determined from test patterns associated features in the reflection image. An offset between a measured position and a written position is calculated (S60) from the measured target pattern origin point and the measured test pattern origin point.

20 Claims, 10 Drawing Sheets

(56) References Cited

U.S. PATENT DOCUMENTS

| | | | |
|---|---|---|---|
| 2002/0024714 A1 | 2/2002 | Sandstrom et al. | |
| 2005/0053273 A1 | 3/2005 | Ostrom et al. | |
| 2005/0275840 A1 | 12/2005 | Gui et al. | |
| 2010/0208229 A1 | 8/2010 | Shin et al. | |
| 2011/0228242 A1 | 9/2011 | Wahlsten et al. | |
| 2017/0343907 A1 | 11/2017 | Nakajima | |
| 2018/0239160 A1 | 8/2018 | Roobol et al. | |
| 2019/0094680 A1 | 3/2019 | Huang et al. | |
| 2019/0113741 A1* | 4/2019 | Kito | G03F 7/20 |
| 2019/0137893 A1* | 5/2019 | Den Boef | G03F 7/70633 |
| 2019/0204180 A1 | 7/2019 | Medvedyeva et al. | |

FOREIGN PATENT DOCUMENTS

| | | |
|---|---|---|
| TW | I671602 B | 9/2019 |
| TW | 201940983 A | 10/2019 |
| TW | I679487 B | 12/2019 |

OTHER PUBLICATIONS

International Search Report for International Application No. PCT/EP2021/062682 dated Aug. 9, 2021.
Taiwan Office Action, dated May 19, 2022, in corresponding Taiwan Patent Application No. 110119786.

\* cited by examiner

OFFSET ALIGNMENT METHOD AND MICRO-LITHOGRAPHIC PRINTING DEVICE

CROSS-REFERENCE TO RELATED APPLICATIONS

This application is a national phase under 35 U.S.C. § 371 of PCT International Application No. PCT/EP2021/062682 which has an International filing date of May 12, 2021, which claims priority to European Application No. 20180453.1, filed Jun. 17, 2020, the entire contents of each of which are hereby incorporated by reference.

TECHNICAL FIELD

The technology presented here refers in general to methods and devices for printing, and in particular to methods and devices for calibration of printers such as mask writers or direct writers.

BACKGROUND

In the semiconductor industry today, masks produced by laser-based mask writers are common for use for manufacturing of different kinds of advanced chips and image devices. Direct writers for e.g. electronic packaging are also standard today. During the last years, the production of larger and more accurate displays has also increased tremendously. Demands are therefore put e.g. on micro-lithographic printing processes to be faster, more accurate and less expensive.

In the field of micro-lithographic printing processes mask writers or direct writers may be based on a printing head providing one or several precision laser beams. The printing head and a substrate to which the writing is intended to be performed are movable relative to each other, either by moving the printing head or the substrate or both. By varying the power of the laser beam coordinated with the relative motion, an exposure pattern can be written onto the substrate.

In some applications, a double, or generally a multiple, writing of patterns on a same substrate may be requested. This may be used for creating areas of differing print heights, e.g. for accomplishing different grey-scale levels on a substrate. An additional writing may be made on top of any type of original pattern. In some applications, the original pattern may be written by the same writer, but in many cases other writers may be used for creating the original pattern onto which the second pattern is going to be printed.

It is easily understood that the alignment of the two or more patterns are crucial. Even a very small offset may cause significant deficiencies in the final product. In order to facilitate alignment, special dedicated pattern details may be provided, typically close to an edge of the substrate. The pattern details are used to fine-adjust the position of a secondary pattern to exactly match the coordinate system of the substrate.

However, in practice, it has been found that most writers have some errors, causing an offset between the nominal position at the substrate and the position at which the laser beam illuminates when it has been instructed to illuminate according to the nominal position. Such small, but noticeable, discrepancies between the ordered position and the real position may typically occur as a result of minor inaccuracies e.g. in the optical systems. Such errors are, however, typically systematic, which means that it is possible to calibrate an offset between intended and real position to be used during printing. The errors are basically individual for each writer and the calibration therefore has to be performed on each separate writer. In case the inaccuracies may shift in time, recalibration may be necessary occasionally.

A typical procedure in prior art to obtain such offset calibrations involves the loading of a primary pattern in the writer according to the nominal positions and the performing of an additional secondary pattern on top of the primary pattern. By reading and inspecting the composite pattern, an offset can be concluded. Often, this procedure is repeated with the obtained offset values in order to validate the result. Such a procedure is very time consuming and therefore typically also expensive, since it causes large non-operation periods. A primary pattern is first to be provided. A new layer of resist is provided on top of the primary pattern. The primary pattern is then placed as a substrate in the writer and aligned according to the included alignment pattern. A new complete writing of the same pattern is performed again. After the exposure, the pattern has to be developed and the composed image has to be read and analyzed. All these procedures are very time consuming.

It is therefore requested for finding alternative approaches for obtaining an alignment for printing a secondary pattern on top of a primary pattern.

SUMMARY

A general object is to provide a less time-consuming offset alignment method for a micro-lithographic printing device.

The above object is achieved by methods and devices according to the independent claims. Preferred embodiments are defined in dependent claims.

In general words, in a first aspect, an offset alignment method for a micro-lithographic printing device comprises placing of an alignment target substrate on a substrate support of the micro-lithographic printing device. The alignment target substrate has a target pattern presenting areas of at least two different light reflectivities. The target pattern is predetermined, defined relative a target pattern origin point. The alignment target substrate is illuminated by a printing head of the micro-lithographic printing device. Light reflected from different points of the alignment target substrate is measured. A reflection image of the target pattern is created by the measured light. The illumination comprises illuminating the alignment target substrate with a test pattern of light. The test pattern has areas with illumination and areas without illumination. The test pattern is predetermined, defined relative a test pattern origin point. A measured target pattern origin point, corresponding to the target pattern origin point, is determined from features in the reflection image that are associated with the target pattern. A measured test pattern origin point, corresponding to the test pattern origin point, is determined from features in the reflection image that are associated with the test pattern. An offset between a measured position and a written position is calculated as the difference between two terms. The first term is a difference between the measured target pattern origin point and the measured test pattern origin point. The second term is a difference between the target pattern origin point and the test pattern origin point.

In a second aspect, a method for printing an additional pattern on a previously patterned substrate comprises placing of the previously patterned substrate at a substrate support. A position of the pattern of the previously patterned substrate is measured. The measuring comprises illumination of the previously patterned substrate by a printing head and recording of reflected light. A pattern definition of the additional pattern with respect to the measured position of the pattern of the previously patterned substrate is obtained. The pattern definition of the additional pattern is adapted by an offset obtained by a method according to the first aspect. The additional pattern is written according to the adapted pattern definition.

In a third aspect, a micro-lithographic printing device comprises a substrate support, a printing head and an imaging device. The printing head comprises illumination means for illuminating a substrate provided at the substrate support. The printing head further comprises an imaging device for measuring reflected light, reflected from different points of the substrate. The imaging device is configured to create a reflection image from the measured reflected light. The illuminating means is configured for illuminating the substrate with a test pattern of light. The test pattern has areas with illumination and areas without illumination. The test pattern is predetermined, defined relative a test pattern origin point. The imaging device is further configured for determining a measured test pattern origin point corresponding to the test pattern origin point from features in the reflection image that are associated with the test pattern. The imaging device is further configured for determining a measured target pattern origin point corresponding to a target pattern origin point from features in the reflection image that are associated with a target pattern of the substrate. The target pattern presents areas of at least two different light reflectivities. The target pattern is predetermined, defined relative to the target pattern origin point. The imaging device is further configured for calculating an offset between a measured position and a written position as the difference between two terms. The first term is a difference between the measured target pattern origin point and the measured test pattern origin point. The second term is a difference between the target pattern origin point and the test pattern origin point.

One advantage with the proposed technology is that a reliable offset alignment can be achieved fast. Other advantages will be appreciated when reading the detailed description.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
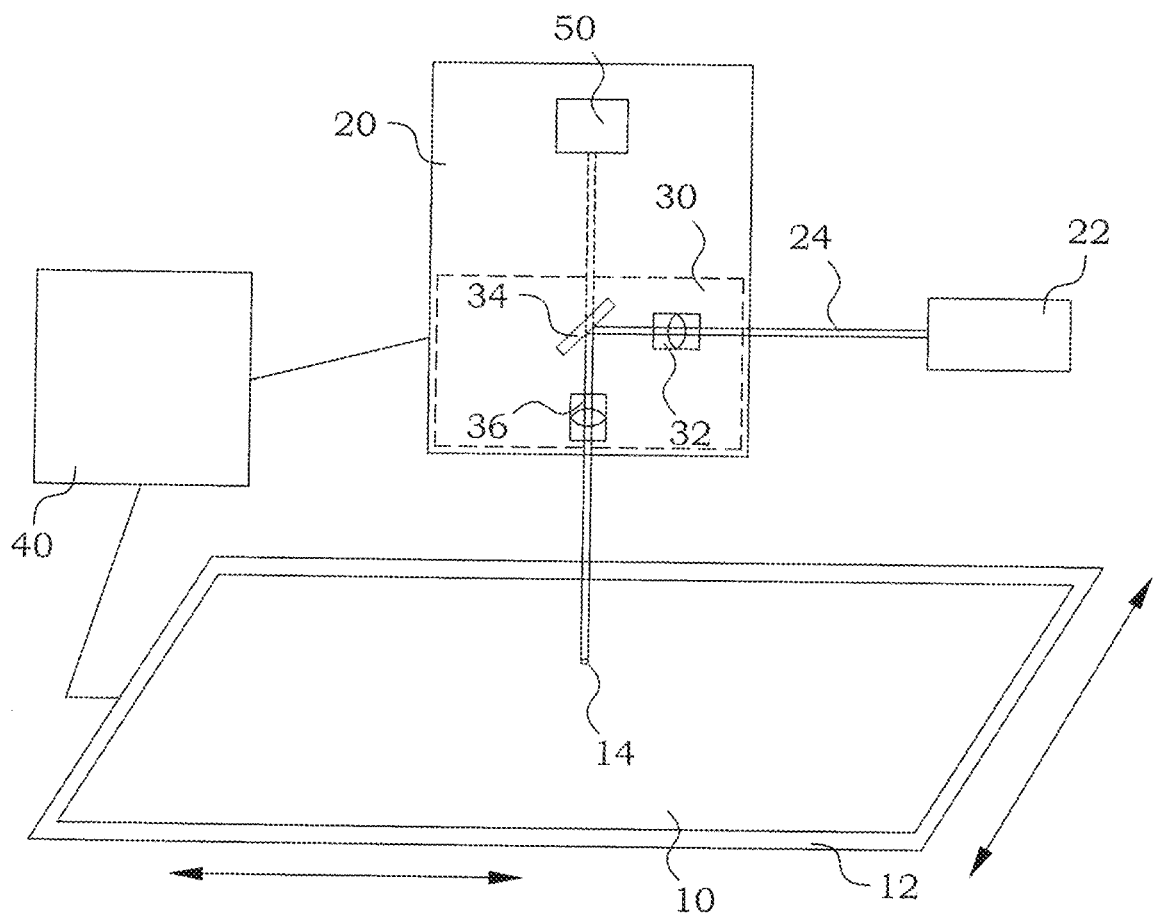
FIG. 1 schematically illustrates an embodiment of a typical micro-lithographic device.

Throughout the drawings, the same reference numbers are used for similar or corresponding elements.

For a better understanding of the proposed technology, it may be useful to begin with a brief overview of an example of a very basic schematic micro-lithographic printing device 1. A substrate 10 is supported on a substrate support 12. A printing head 20 comprises a laser source 22 and an optical arrangement 30. Laser radiation 24 emitted from the laser source 22 passes through the optical arrangement 30 and is thereby directed to an illumination point 14 at the substrate 10. The printing head 20 is movable, schematically illustrated by a displacement control 40, relative to the substrate support 12, enabling selection of illumination point 14 at the substrate 10. This relative displacement can be implemented by physically moving the substrate support 12, by moving the optical arrangement 30 of the printing head 20 or both. Displacements of the illumination points 14 may also be performed by the optical arrangement, e.g. by deflecting the laser radiation 24.

There are many different prior art approaches to how to design the optical arrangement. These details are not of any primary importance for the present ideas and are therefore not further discussed. It can, however, be noticed that there are designs using multiple illumination points 14.

In a typical writing process, a substrate 10 covered with resist is illuminated. The resist is developed and a pattern corresponding to the varying illumination is presented. In cases, where a second, or further, layer of the pattern is requested, the substrate is once more covered with resist and a further writing process is performed on top of the original one. Here, it is of crucial importance that an alignment between the two patterns is achieved, as was described in the background.

A printing head 20 of a micro-lithographic printing device 1 may typically also be utilized as an imaging device. A substrate with a pattern is placed at the substrate support 12. The substrate is illuminated at the illumination point 14 by the laser radiation 24. Depending on the pattern, different amount of the laser radiation 24 is reflected and may be detected by an imaging device 50. This imaging device 50 may be incorporated in the printing head 20 or may be provided as a separate unit. By moving the illumination point 14 over the patterned substrate, an image can be created by the variations in the reflected light.

The imaging accuracy of the imaging of such images is relatively good. Relative positions between different features in the image are provided with very good accuracy, However, the absolute positioning of the acquired image may be less accurate. This may be dependent e.g. on the physical movements or the optical displacements used during the acquiring process. In other words, imaging errors are present, however, the main part of them are systematic errors. Such systematic errors are possible to compensate by different alignment processes.

As mentioned in the background, a straightforward approach is to print a second image on top of a first image, and then measure the offsets between the intended positions of the two images. However, such procedure requires two successive exposures and associated developing as well as a final imaging process. This takes time and requires the manufacturing of test substrates that eventually are discarded. Typically, such an alignment process is also repeated in order to verify the results.

Figure 2:
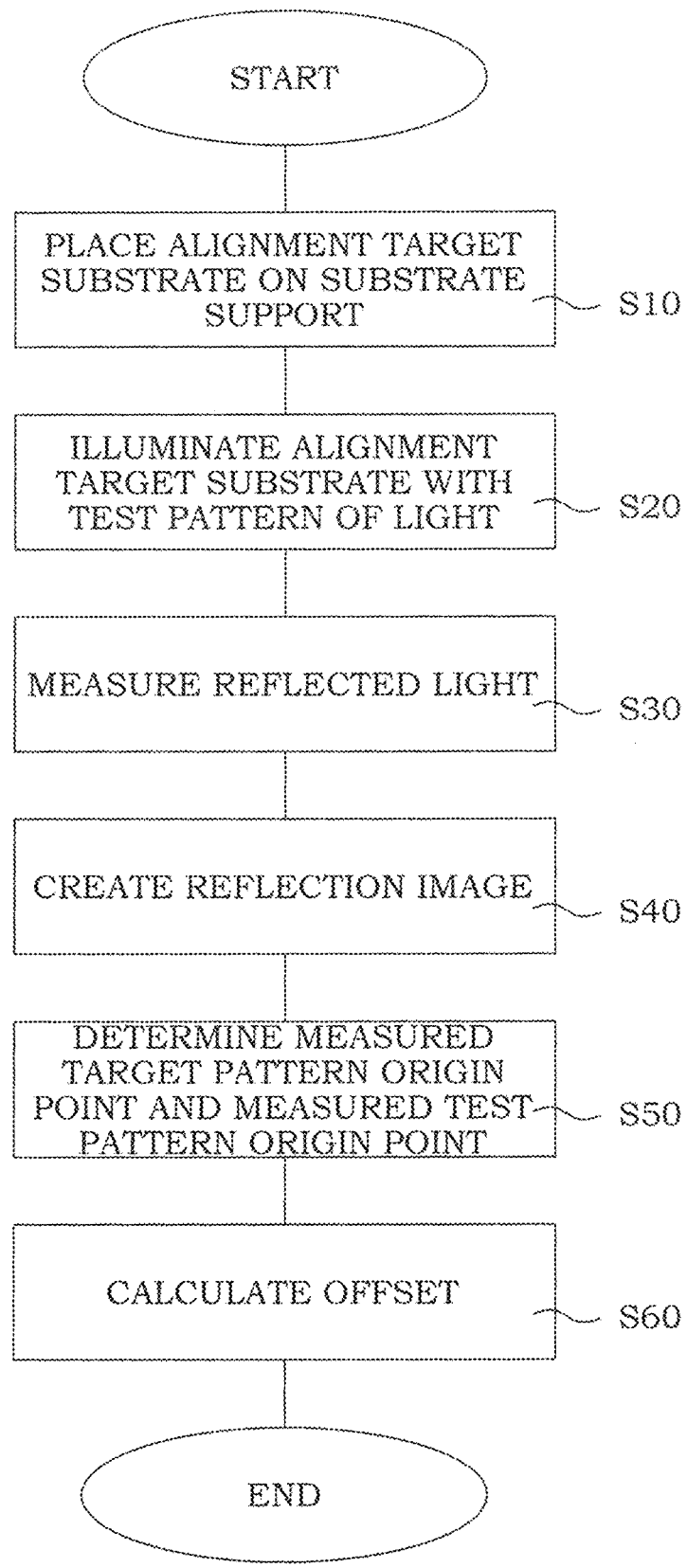
FIG. 2 is a flow diagram of steps of an embodiment of an offset alignment method for a micro-lithographic printing device.

Therefore, a new approach is presented here. FIG. 2 illustrates a flow diagram of steps of an embodiment of an offset alignment method for a micro-lithographic printing device. In step S10, an alignment target substrate is placed on a substrate support of the micro-lithographic printing device. The alignment target substrate has a target pattern presenting areas of at least two different light reflectivities. The target pattern is predetermined, defined relative a target pattern origin point.

In step S20, the alignment target substrate is illuminated by a printing head of the micro-lithographic printing device. The illumination comprises illuminating the alignment target substrate with a test pattern of light. The test pattern has areas with illumination and areas without illumination. The test pattern is predetermined, defined relative a test pattern origin point.

There are thus two patterns under consideration. The target pattern is provided as a physical pattern at the alignment target substrate. The test pattern is provided as a light modulation provided by the printing head during illumination. This test pattern is thus not physically available but is only present as an amount of data representing definitions of when light is to be provided or not. Both these patterns are defined relative a respective origin point, which corresponds to a nominal origin point of the respective pattern.

In step S30, light reflected from different points of the alignment target substrate is measured. In step S40, a reflection image of the target pattern is created by the measured light. This is achieved by knowledge of the nominal relative motion of the illumination point.

This reflection image is thus created by the cooperation of the two patterns. The target pattern provides an intensity influence by means of a changing reflectivity over the target pattern. The test pattern influences the final reflection image by its light modulation.

In step S50, a measured target pattern origin point, corresponding to the target pattern origin point, is determined from such features in the reflection image that are associated with the target pattern. Likewise, a measured test pattern origin point, corresponding to the test pattern origin point, is determined from such features in the reflection image that are associated with the test pattern.

Expressed in other words, the physical target pattern is defined relative the nominal target pattern origin point. In the reflection image, the target pattern associated features are used to re-create a copy of the target pattern, and by this determine a measured target pattern origin point. Analogously, the light-modulated test pattern is defined relative the nominal test pattern origin point. In the reflection image, the test pattern associated features are used to re-create a copy of the test pattern, and by this determine a measured test pattern origin point.

The relation between the target pattern origin point and the test pattern origin point is known by definition. By investigating a corresponding relation between the measured target pattern origin point and the measured test pattern origin point, information of any misalignment can be achieved.

To this end, in step S60, an offset between a measured position and a written position is calculated as the difference between on one hand a difference between the measured target pattern origin point and the measured test pattern origin point, and on the other hand a difference between the target pattern origin point and the test pattern origin point. In other words, an offset between a measured position and a written position is calculated as the difference between two terms. The first term is a difference between the measured target pattern origin point and the measured test pattern origin point. The second term is a difference between the target pattern origin point and the test pattern origin point.

An offset between the measured and written position can thus be provided without the need of a second pattern exposure. The time for performing such an alignment is therefore reduced significantly compared with prior art approaches based on additional exposures. Also, the alignment target substrate is unspoiled and can be utilized repeatedly for update alignment procedure on the same micro-lithographic printing device as well as for alignment procedures on other micro-lithographic printing device. This approach thus saves a lot of non-operational time of the micro-lithographic printing devices. And furthermore, less substrates used for alignment procedures have to be discarded.

Figure 3:
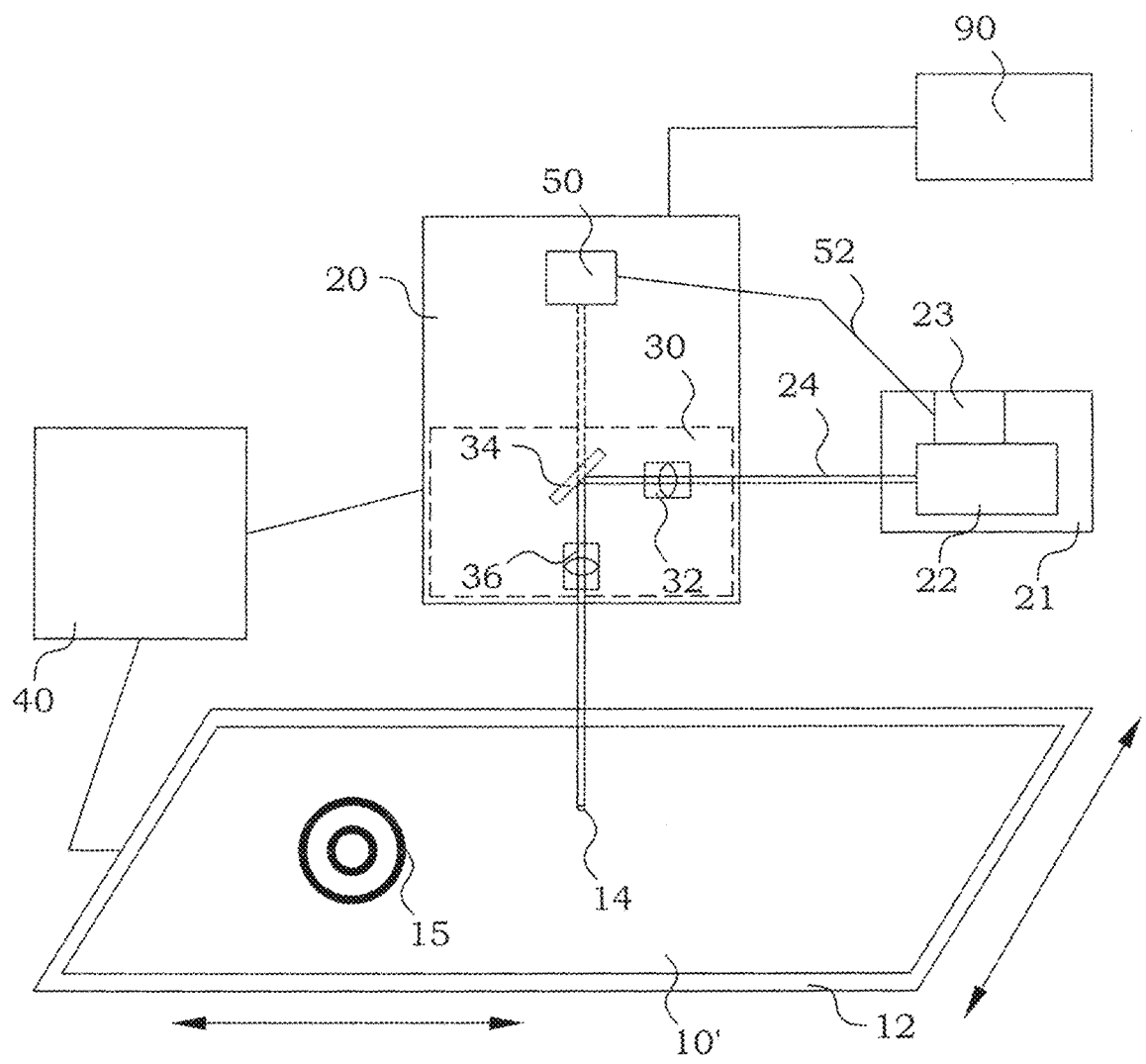
FIG. 3 schematically illustrates an embodiment of a typical micro-lithographic device configured for offset alignment.

FIG. 3 illustrates schematically an embodiment of micro-lithographic printing device 1 according to the above principles. The micro-lithographic printing device 1 comprises a substrate support 12, onto which a substrate 10' provided with a target pattern 15 can be placed. The micro-lithographic printing device 1 further comprises a printing head 20. The printing head 20 comprises illumination means 21 for illuminating the substrate 10' when placed at the substrate support 12. The illumination means 21 typically comprises a laser source 22.

The printing head 20 further comprising an imaging device 50 for measuring reflected light, reflected from different points of the substrate 10'. The imaging device 50 is further configured to create a reflection image from the measured reflected light. The illuminating means 21 is configured for illuminating the substrate with a test pattern of light. The test pattern has areas with illumination and areas without illumination. The test pattern is predetermined, defined relative a test pattern origin point. Typically, the illumination means 21 comprises an illumination control 23, configured for synchronizing the illumination with relative movements of the illumination point 14. Also, typically, there is a communication 52 between the illumination control 23 and the imaging device 50 for creating a simple cooperation therebetween.

The imaging device 50 is further configured for determining a measured test pattern origin point corresponding to the test pattern origin point from features in the reflection image that are associated with the test pattern. The imaging device 50 is further configured for determining a measured target pattern origin point corresponding to a target pattern origin point from features in the reflection image that are associated with a target pattern 15 of the substrate 10'. The target pattern 15 presents areas of at least two different light reflectivities. The target pattern 15 is predetermined, defined relative to the target pattern origin point. The imaging device 50 is further configured for calculating an offset between a measured position and a written position as the difference between on one hand a difference between the measured target pattern origin point and the measured test pattern origin point, and on the other hand a difference between the target pattern origin point and the test pattern origin point.

One important aspect of the present ideas is the interaction between two different patterns, giving rise to a composed pattern, from which any offsets between the two original patterns can be detected.

Figure 4A:
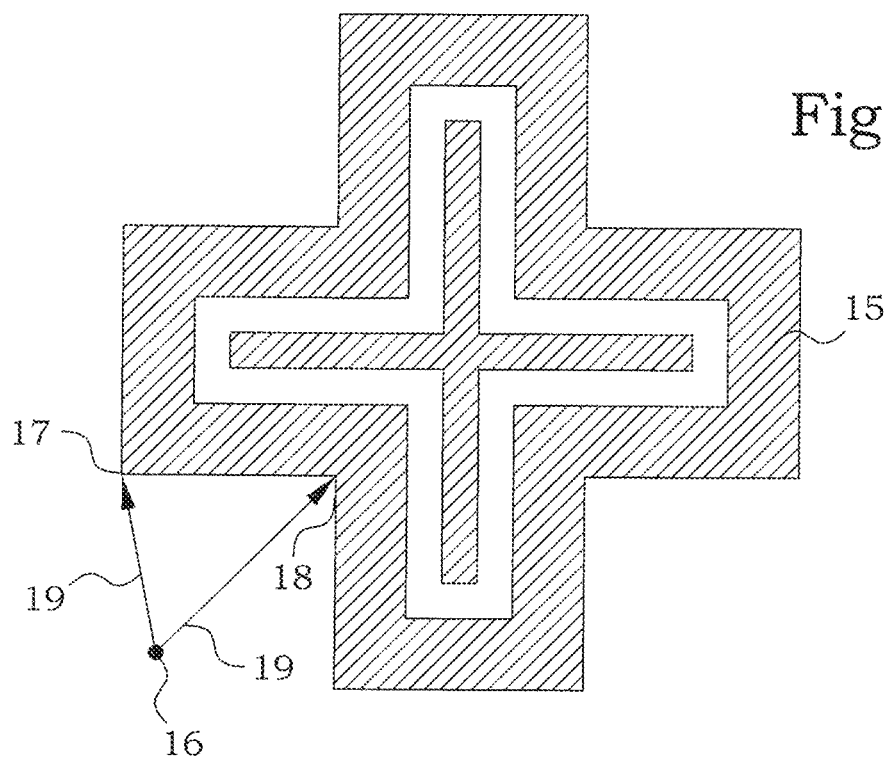
FIG. 4A illustrates an embodiment of a target pattern.

In FIG. 4A, an embodiment of a target pattern 15. In this embodiment, the target pattern 15 has a general cross-shape with a middle empty structure. The target pattern 15 is pre-defined relative a target pattern origin point 16. This means that the features of the target pattern 15 are defined relative to the target pattern origin point 16. For instance, the positions of the outer corner 17 and the inner corner 18 are defined by vectors 19 relative the target pattern origin point 16. Once the position of the target pattern origin point 16 is decided, the entire target pattern 15 is fully defined.

Figure 4B:
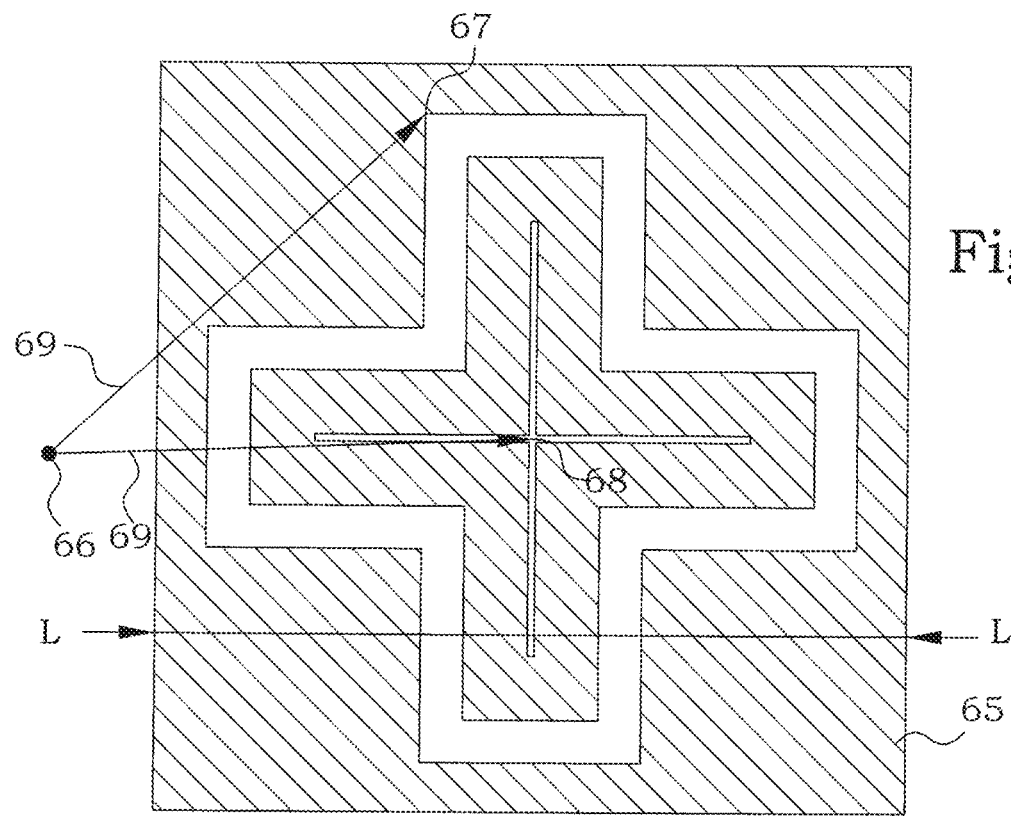
FIG. 4B illustrates an embodiment of a test pattern intended to be used together with the target patterns if FIG. 4A.

In FIG. 4B, an embodiment of a test pattern 65 is illustrated. This test pattern 65 does not as such exist as a physical pattern but is defined in terms of light modulation associated with different positions of an illumination point. In other words, the test pattern 65 exists as an amount of data controlling a cooperation between a laser source and a printing head. Also, the test pattern 65 is pre-defined relative a test pattern origin point 66. As above, this means that the features of the test pattern 65 are defined relative to the test pattern origin point 66. For instance, the positions of the corner 67 and the middle point 68 are defined by vectors 69 relative the test pattern origin point 66. Once the position of the test pattern origin point 66 is decided, the entire test pattern 65 is fully defined.

When overlaying these patterns, a relative position between the target pattern origin point 16 and the test pattern origin point 66 is determined so that a requested relation between the two patterns is obtained, at least in an ideal case. This would thus be case without any systematic offsets. In the examples above, such an ideal overlay pattern would occur when the centers of the two patterns coincide. This corresponds to a certain relative position between the target pattern origin point 16 and the test pattern origin point 66.

Figure 4C:
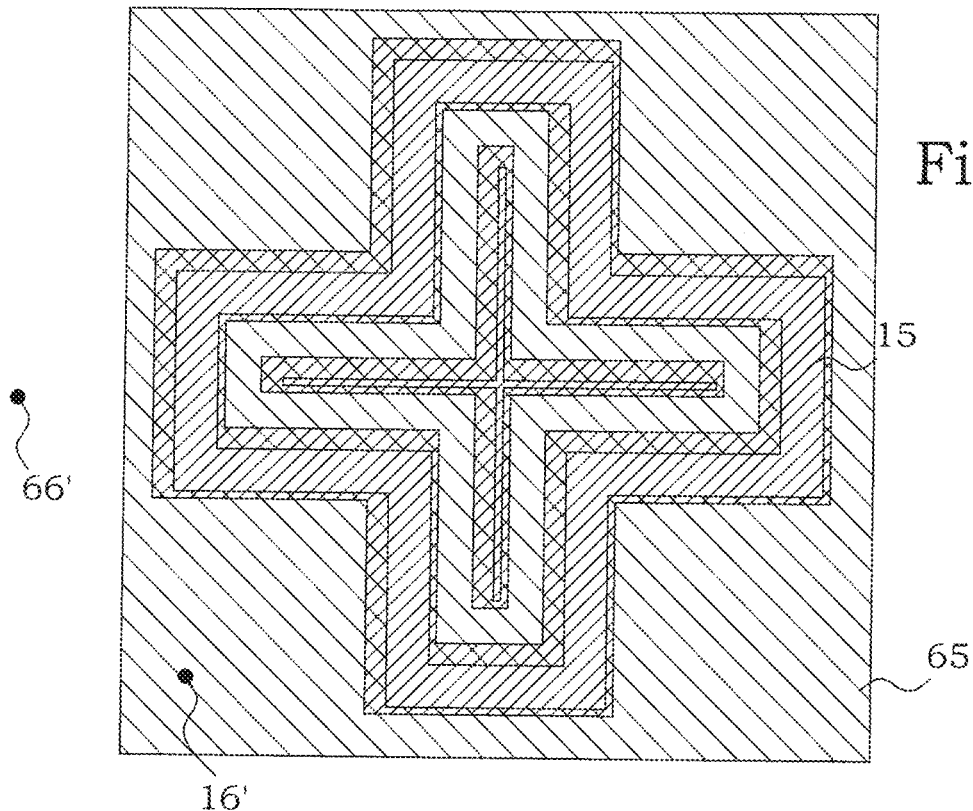
FIG. 4C illustrates an embodiment of a composed pattern when applying the test pattern on a target pattern with a minor offset.

As for a more realistic situation, FIG. 4C illustrates a schematic overlap drawing of the target pattern 15 of FIG. 4A and the test pattern 65 of FIG. 4B, however, in the presence of a small offset. In the overlap drawing, the main features of the two patterns are still easily identifiable. However, it can be noticed that the centers of the patterns do not coincide perfectly.

By measuring such a composed pattern and by comparing the features of the composed pattern with the definition of the target pattern, a measured target pattern origin point 16' can be determined. Likewise, by measuring such a composed pattern and by comparing the features of the composed pattern with the definition of the test pattern, a measured test pattern origin point 66' can be determined. A relative position between the measured target pattern origin point 16' and the measured test pattern origin point 66' can therefore also be determined. A difference between this relative position between the measured patterns and the corresponding relative position of the patterns as defined then corresponds to the small offset. Compensation for this offset can then easily be implemented.

Figure 4D:
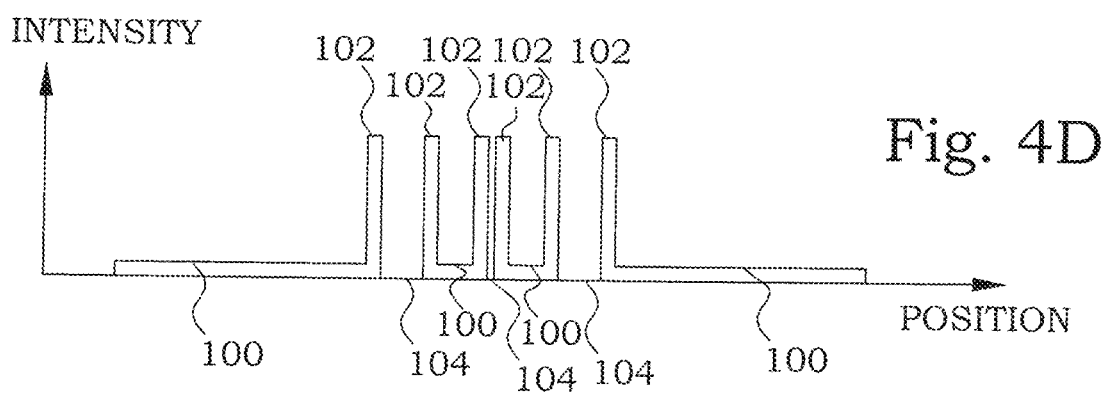
FIG. 4D illustrates examples of intensity variations along a line in a measured image based on patterns of FIGS. 4A and 4B for an ideal alignment.

FIG. 4D is a diagram illustrating an intensity variation of an ideal composed pattern along a line corresponding to the line L-L in FIG. 4B. The intensity variations show three distinct levels. In the regions 100, the target pattern is absent, but the light of the test pattern is "on", which means that the substrate only performs a low reflection of impinging light. However, the reflected light is on a level clearly distinguishable from zero. In regions 102, both the target pattern and the test pattern are present. The substrate then provides a high degree of reflection, and the measured reflected intensity is considerably higher than for the regions 100. Finally, in regions 104, the light of the test pattern is turned off, and no light at all is reflected, giving an essentially zero measured signal.

In the ideal situation of FIG. 4D, the regions 100, 102, 104 are provided in a symmetrical manner, where the regions 104 are provided symmetrically around the same point as the regions 102 present. In this case, there is no offset in the direction of the line L-L.

Figure 4E:
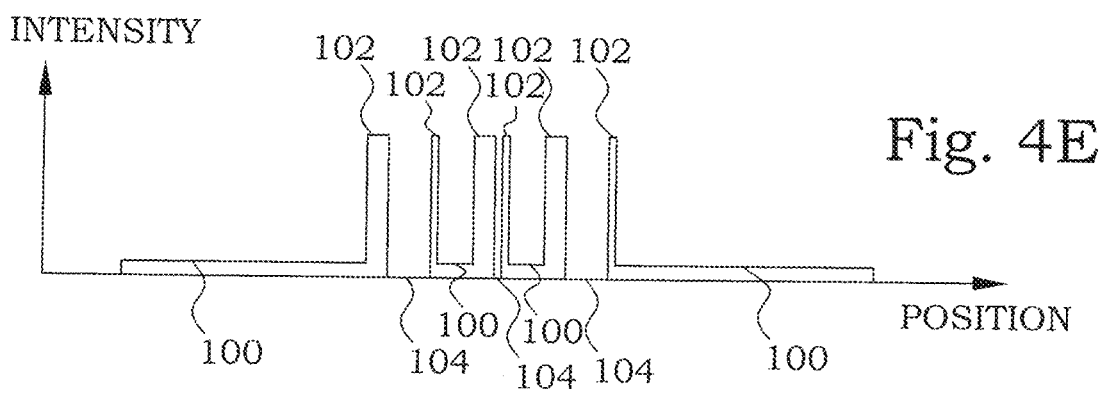
FIG. 4E illustrates examples of intensity variations along a line in a measured image based on patterns of FIGS. 4A and 4B with a minor offset.

FIG. 4E illustrates instead a situation where an offset is present, e.g. according to FIG. 4C. Here, it can be noticed that the regions are asymmetric. However, it is still possible to identify the different regions. By analyzing the positions of the transitions between regions 102 and regions 104, a center position for the regions 104 can be determined. Similarly, by analyzing the positions of the transitions between regions 100 and 102, a center position for the target pattern structures can be deduced. A difference between these center positions corresponds to the existing offset.

Figure 5:
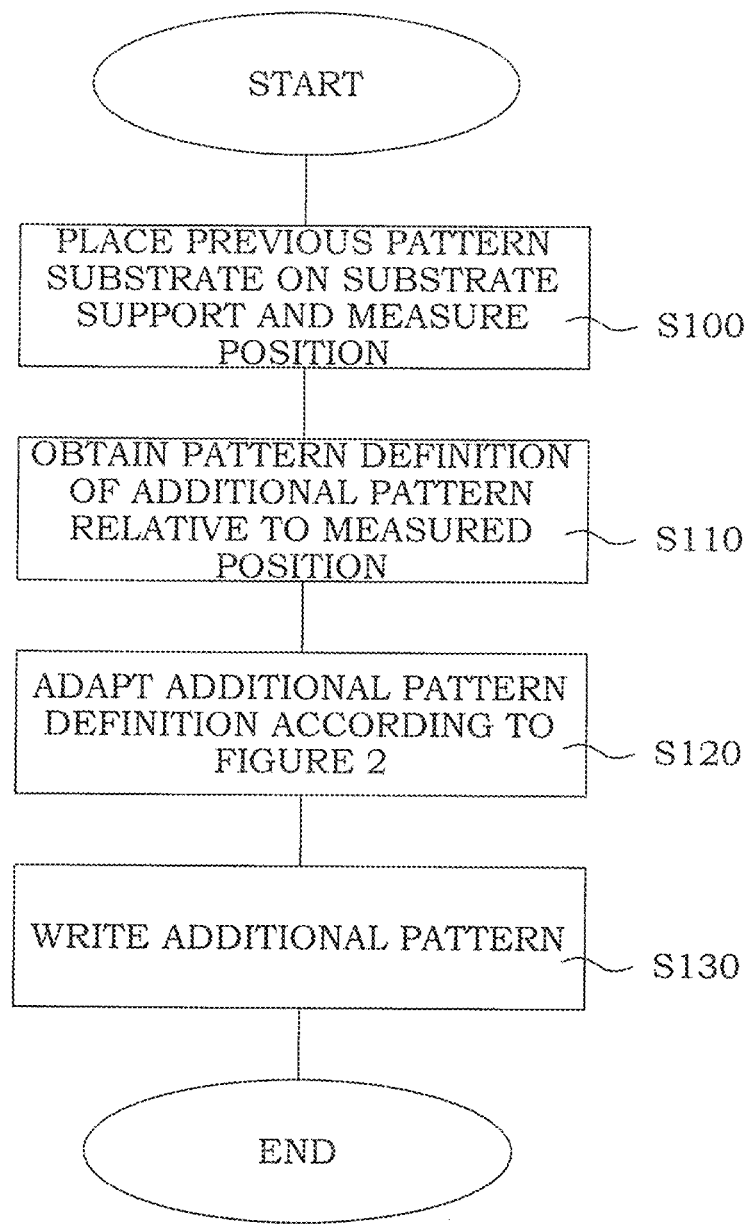
FIG. 5 is a flow diagram of steps of an embodiment of a method for printing an additional pattern on a previously patterned substrate.

FIG. 5 illustrates schematically a flow diagram of steps of an embodiment of a method for printing an additional pattern on a previously patterned substrate. In step S100, the previously patterned substrate is placed at a substrate support. A position of the pattern of the previously patterned substrate is measured. The measuring comprises illumination of the previously patterned substrate by a printing head and recording of reflected light. In step S110, a pattern definition of the additional pattern with respect to the measured position of the pattern of the previously patterned substrate is obtained. In step S120, the pattern definition of the additional pattern is adapted by an offset obtained by a method according to FIG. 2. In step S130, the additional pattern is written according to the adapted pattern definition.

The operation of the above presented ideas is dependent on target and test patterns. The shapes and sizes of these patterns may be adapted for certain implementations in order to facilitate the pattern analysis.

The above method is applicable in one dimension as well as in two dimensions. The two-dimensional case is the most common, and in such implementations, the target pattern and the test pattern both have to have edges in at least two non-parallel directions. In such cases, the determining comprises determining the measured target pattern origin point corresponding to the target pattern origin point from edge features in the reflection image that are associated with the edges of the target pattern and determining the measured test pattern origin point corresponding to the test pattern origin point from edge features in the reflection image that are associated with the edges of the test pattern.

The patterns of FIGS. 4A and 4B are typical examples of such patterns having edges in more than one direction. In that case, both the test pattern and the target pattern have edges in two perpendicular directions.

Figure 6A:
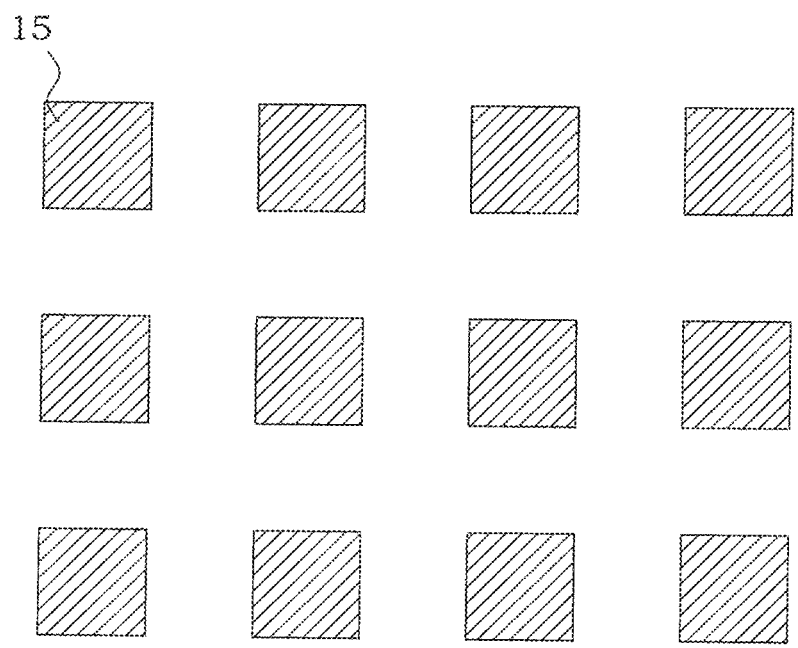
FIG. 6A illustrates another embodiment of a target pattern.
Figure 6B:
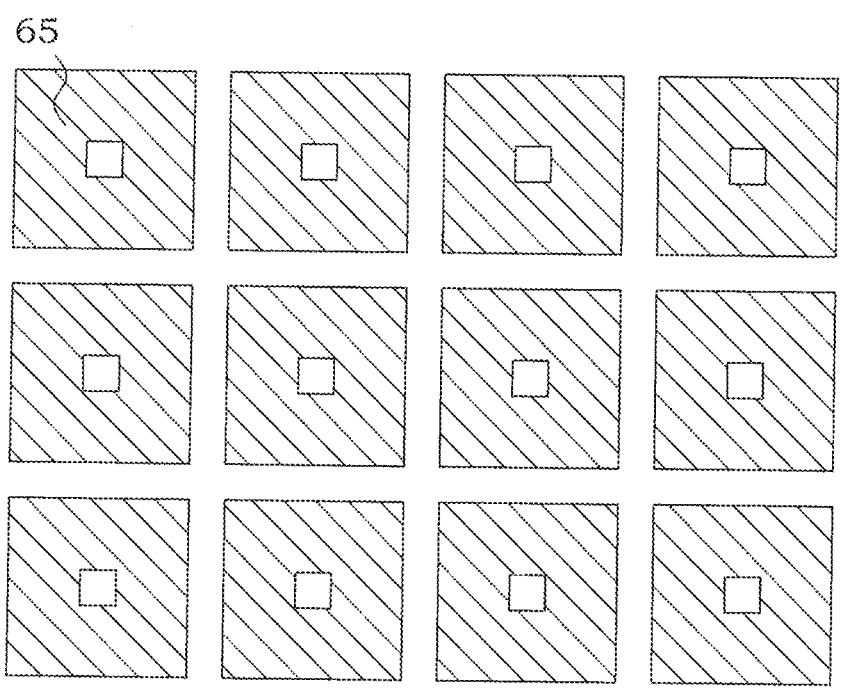
FIG. 6B illustrates another embodiment of a test pattern intended to be used together with the target patterns if FIG. 6A.

FIG. 6A illustrates another embodiment of a target pattern, comprising an array of squares. FIG. 6B illustrates an embodiment of a test pattern that will operate well together with the target pattern of FIG. 6A. The test pattern of FIG. 6B comprises an array of squares, slightly larger than the squares of the target pattern. Within the test pattern squares, there are small square areas, where the illumination is prohibited. These small squares are somewhat smaller than the squares of the target pattern.

Figure 7A:
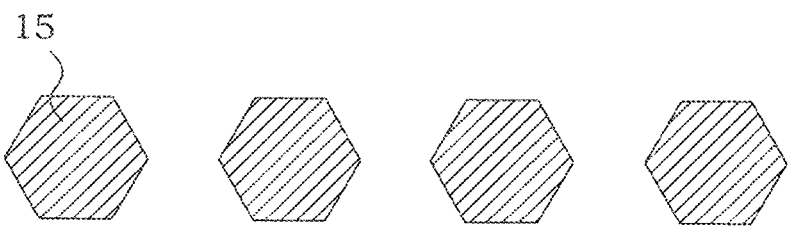
FIG. 7A illustrates yet another embodiment of a target pattern.
Figure 7B:
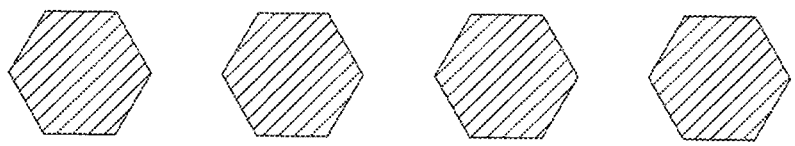
FIG. 7B illustrates yet another embodiment of a test pattern intended to be used together with the target patterns if FIG. 7A.
Figure 7B:
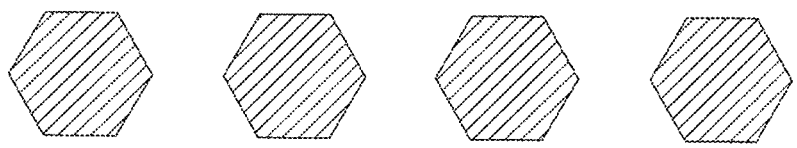
Figure 7B:
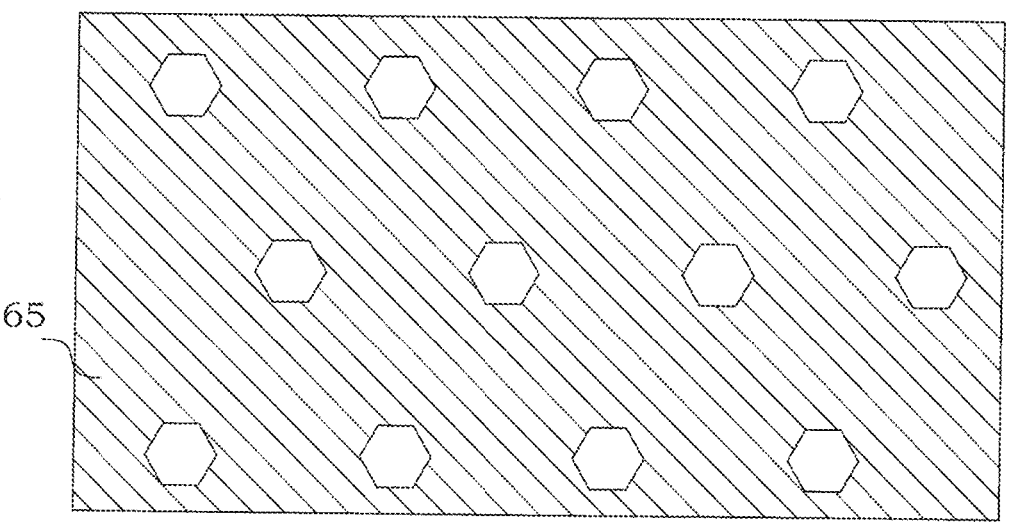

FIG. 7A illustrates another embodiment of a target pattern, comprising an array of hexagons. FIG. 7B illustrates an embodiment of a test pattern that will operate well together with the target pattern of FIG. 7A. The test pattern of FIG. 7B comprises an illuminated area with hexagonal areas in an array where illumination is prohibited. These non-illuminated areas fit into the hexagons of the target pattern, with a certain margin. Here, edges in three non-parallel directions are provided for determining any prevailing offsets.

Figure 7C:
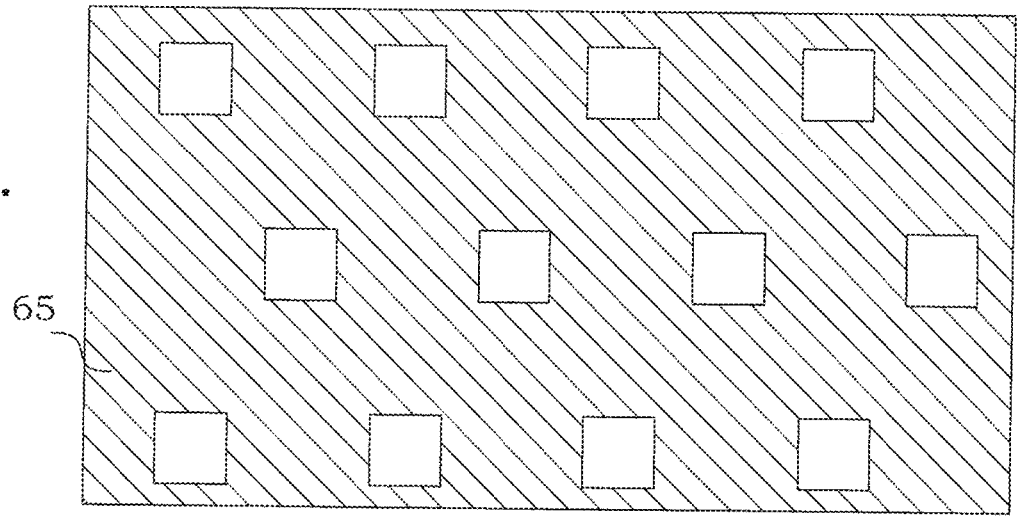
FIG. 7C illustrates yet another embodiment of a test pattern intended to be used together with the target patterns if FIG. 7A.

FIG. 7C illustrates another embodiment of a test pattern that will operate well together with the target pattern of FIG. 7A. The test pattern of FIG. 7C comprises an illuminated area with square areas in an array where illumination is prohibited. These non-illuminated areas fit into the hexagons of the target pattern, with a certain margin. Here, edges in three non-parallel directions are provided in the target pattern, while edges in two non-parallel directions are provided in the test pattern.

Figure 8A:
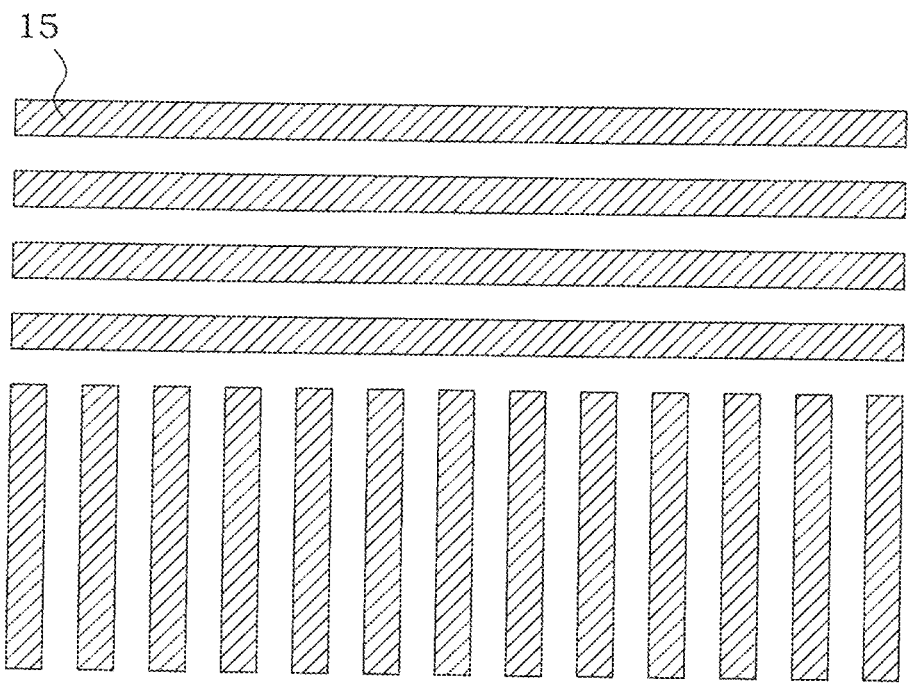
FIG. 8A illustrates yet another embodiment of a target pattern.
Figure 8B:
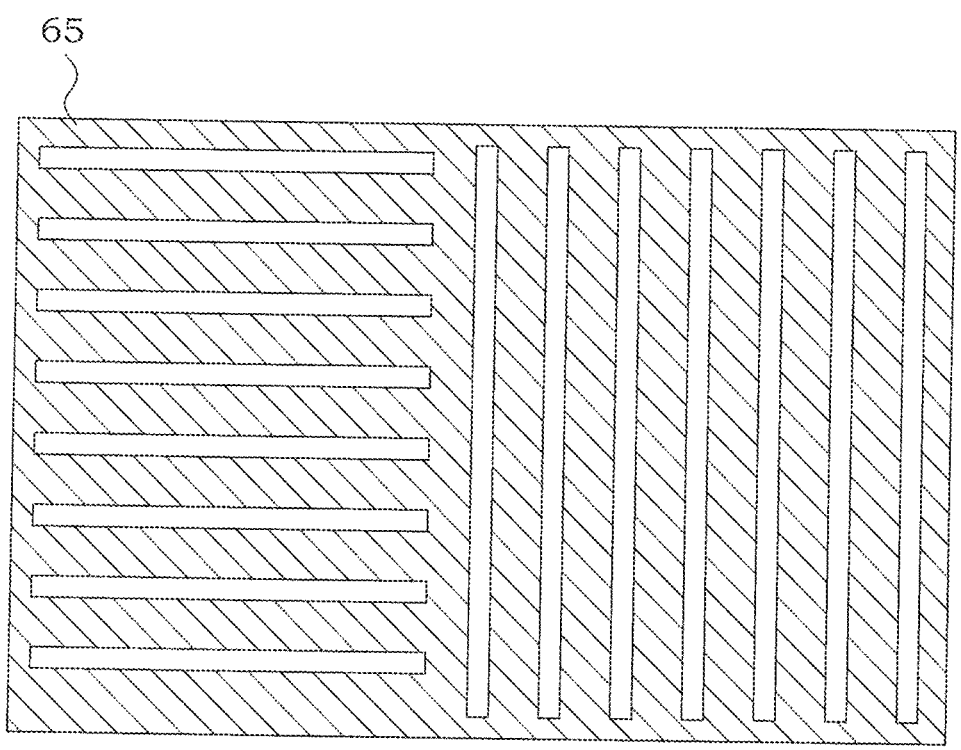
FIG. 8B illustrates yet another embodiment of a test pattern intended to be used together with the target patterns if FIG. 8A.

FIG. 8A illustrates another embodiment of a target pattern, comprising a first field of lines in one direction and a second field of lines in a perpendicular direction. FIG. 8B illustrates an embodiment of a test pattern that will operate well together with the target pattern of FIG. 8A. The test pattern of FIG. 8B comprises a first field of lines in one direction and a second field of lines in a perpendicular direction, however, these fields do not overlap with the target pattern fields.

It can be noted that in cases a one-dimensional offset adjustment is to be performed, the upper left quarter or lower right quarter of the patterns may e.g. be used as target and test patterns.

Figure 9A:
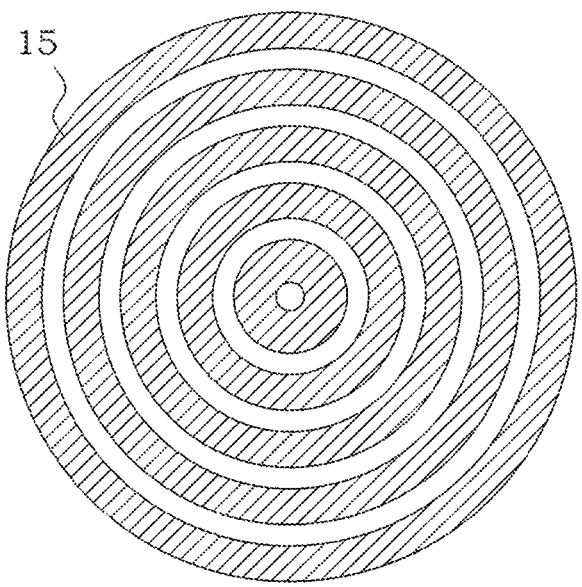
FIG. 9A illustrates yet another embodiment of a target pattern.
Figure 9B:
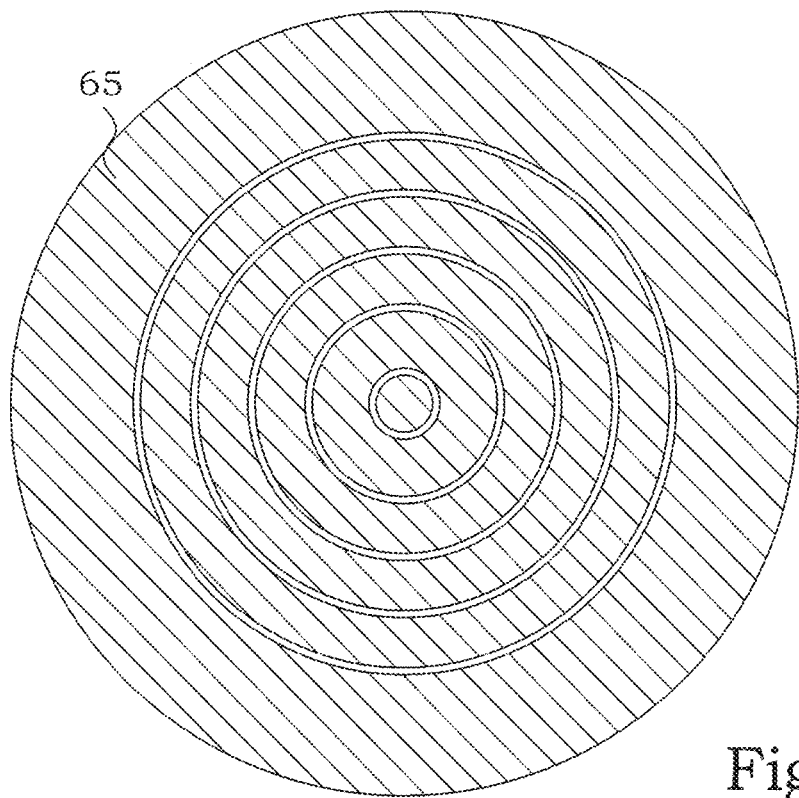
FIG. 9B illustrates yet another embodiment of a test pattern intended to be used together with the target patterns if FIG. 9A.

FIG. 9A illustrates another embodiment of a target pattern, comprising a series of concentric circles. FIG. 9B illustrates an embodiment of a test pattern that will operate well together with the target pattern of FIG. 9A. The test pattern of FIG. 9B comprises a series of concentric circles, where the illumination is stopped. These non-illuminated circles fall within the circles of the target pattern. In this embodiment, there are edges presented by the patterns, directed in all possible directions. When using such a target and test patterns, being based on circles, there are useful prior art routines to determine e.g. a center point of such circles. This center point could then e.g. be used as the test pattern origin point and/or the target pattern origin point.

In other words, one embodiment, at least one of the test pattern and the target pattern has a circular symmetry. In a further embodiment, at least one of the test pattern origin point and the target pattern origin point is equal to a center of the circular symmetry.

As anyone skilled in the art understands, the possible variations of target patterns and test patterns are virtually unlimited. A proper choice of geometry may be based on the actual implementation, e.g. if certain directions are more crucial than others.

In a typical embodiment, the alignment target substrate is a glass or quartz plate provided by a metal coating in the shape of the target pattern. Thereby the at least two reflectivities are the reflectivity of the glass or quartz surface and the reflectivity of the metal surface, respectively.

The reflectivity of glass or quartz is typically relatively low compared to the reflectivity of the metal coating. The edges between coated areas and non-coated areas are therefore relatively easily detected, if the illumination is present over the edge. When determining the edges of the test pattern, an edge of the test pattern occurring in an area of the metal coating gives a much higher contrast compared to a situation where a test pattern edge is situated in an area not covered by the metal. It is therefore preferred to have at least some test pattern edges that are positioned in areas where the metal coating of the target pattern is present.

In other words, in one embodiment, the test pattern is designed to have borders between illuminated and non-illuminated areas overlapping with areas of a highest reflectivity, of the at least two different light reflectivities, of the target pattern.

As being possible to conclude from the exemplifying illustrations above, in one embodiment, at least one of the test pattern and the target pattern has edges at least in two perpendicular directions.

In one embodiment, at least one of the test pattern and the target pattern has edges in more than two non-parallel directions.

In one embodiment, at least one of the test pattern and the target pattern is symmetrical with respect to at least one line.

In one embodiment, at least one of the test pattern and the target pattern is symmetrical with respect to two perpendicular lines.

It was mentioned above that the origin points of the two patterns are possible to defined independently from each other. However, as a matter of convenience, in one embodiment, the target pattern origin point is equal to the test pattern origin point. Thereby, the offset becomes equal to the difference between the measured target pattern origin point and the measured test pattern origin point.

In view of the discussion above and with reference again to FIG. 3, in one embodiment, both the target pattern and the test pattern have edges in at least two non-parallel directions. The imaging device 50 is then configured for determining the measured test pattern origin point corresponding to the test pattern origin point from edge features in the reflection image that are associated with edges of the test pattern. The imaging device 50 is further configured for determining the measured target pattern origin point corresponding to the target pattern origin point from edge features in the reflection image that are associated with edges of the target pattern of the substrate.

As mentioned further above, the printing head of a micro-lithographic printing device may in certain embodiments utilize a multiple of laser beams simultaneously. These beams illuminate or does not illuminate different points at the substrate. Such designs open up for a simultaneous recording of a measured composed pattern from more than one point. However, the general methodology of the offset compensation is still the same.

It was also mentioned above that the printing head of a micro-lithographic printing device may in certain embodiments be swept with respect to the substrate support, e.g. by optical means. In such an embodiment, where the printing head is sweeping with respect to the substrate support, the printing head further comprises modulating means for modulating illuminating light from the printing head in time synchronization with the sweeping. The printing head then further comprises a light detector configured for recording time fluctuations of reflected light. The imaging device is also configured to create the reflection image by use of the recorded time fluctuations of reflected light.

In a method aspect, it can be expressed as that the printing head is sweeping with respect to the substrate support. The test pattern is created by modulating illuminating light from the printing head in time synchronization with the sweeping. Thereby the reflection image is created by recording time fluctuations of reflected light.

With reference to FIG. 3, when coming to an actual printing of an additional pattern onto an existing pattern, the micro-lithographic printing device comprises a pattern writing control unit 90. The pattern writing control unit 90 is configured to provide printing data to the printing head 20. The printing data comprises a pattern definition of an additional pattern to be printed onto a previously patterned substrate. The pattern writing control unit 90 is configured for adapting the pattern definition according to the offset, obtained according to the ideas presented herein.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. An offset alignment method for a micro-lithographic printing device, comprising the steps of:
    placing an alignment target substrate on a substrate support of said micro-lithographic printing device;
    said alignment target substrate having a target pattern presenting areas of at least two different light reflectivities;
    said target pattern being predetermined, defined relative a target pattern origin point;
    illuminating, by a printing head of said micro-lithographic printing device, said alignment target substrate;
    measuring light reflected from different points of said alignment target substrate;
    creating a reflection image of said target pattern by said measured light;
    said illuminating comprises illuminating said alignment target substrate with a test pattern of light;
    said test pattern having areas with illumination and areas without illumination;
    said test pattern being predetermined, defined relative a test pattern origin point;
    determining a measured target pattern origin point corresponding to said target pattern origin point from features in said reflection image being associated with said target pattern and determining a measured test pattern origin point corresponding to said test pattern origin point from features in said reflection image being associated with said test pattern;
    calculating an offset between a measured position and a written position as the difference between on one hand a difference between said measured target pattern origin point and said measured test pattern origin point, and on the other hand a difference between said target pattern origin point and said test pattern origin point.

2. The offset alignment method according to claim 1, wherein both said target pattern and said test pattern have edges in at least two non-parallel directions, whereby said determining comprises determining said measured target pattern origin point; corresponding to said target pattern origin point from edge features in said reflection image being associated with said edges of said target pattern and determining said measured test pattern origin point corresponding to said test pattern origin point from edge features in said reflection image being associated with said edges of said test pattern.

3. The offset alignment method according to claim 2, wherein said test pattern is designed to have borders between illuminated and non-illuminated areas overlapping with areas of a highest reflectivity, of said at least two different light reflectivities, of said target pattern.

4. The offset alignment method according to claim 2, wherein at least one of said test pattern and said target pattern has edges at least in two perpendicular directions.

5. The offset alignment method according to claim 1, wherein said test pattern is designed to have borders between illuminated and non-illuminated areas overlapping with areas of a highest reflectivity, of said at least two different light reflectivities, of said target pattern.

6. The offset alignment method according to claim 5, wherein at least one of said test pattern and said target pattern has edges at least in two perpendicular directions.

7. The offset alignment method according to claim 1, wherein at least one of said test pattern and said target pattern has edges at least in two perpendicular directions.

8. The offset alignment method according to claim 1, wherein at least one of said test pattern and said target pattern has edges in more than two non-parallel directions.

9. The offset alignment method according to claim 1, wherein at least one of said test pattern and said target pattern is symmetrical with respect to at least one line.

10. The offset alignment method according to claim 9, wherein at least one of said test pattern and said target pattern is symmetrical with respect to two perpendicular lines.

11. The offset alignment method according to claim 1, wherein at least one of said test pattern and said target pattern has a circular symmetry.

12. The offset alignment method according to claim 11, wherein at least one of said test pattern origin point and said target pattern origin point is equal to a center of said circular symmetry.

13. The offset alignment method according to claim 1, wherein said target pattern origin point is equal to said test pattern origin point, whereby said offset becomes equal to said difference between said measured target pattern origin point and said measured test pattern origin point.

14. The offset alignment method according to claim 1, wherein said alignment target substrate is a glass or quartz plate provided by a metal coating in the shape of said target pattern, whereby said at least two reflectivities are the reflectivity of said glass or quartz surface and the reflectivity of said metal surface, respectively.

15. The offset alignment method according to claim 1, wherein said printing head is sweeping with respect to said substrate support, whereby said test pattern is created by modulating illuminating light from said printing head in time synchronized with said sweeping, whereby said reflection image is created by recording time fluctuations of reflected light.

16. A method for printing an additional pattern on a previously patterned substrate, comprising the steps of:
  placing said previously patterned substrate at a substrate support;
  measuring a position of the pattern of said previously patterned substrate;
  said measuring comprising illumination of said previously patterned substrate by a printing head and recording of reflected light;
  obtaining a pattern definition of said additional pattern with respect to said measured position of the pattern of said previously patterned substrate;
  adapting said pattern definition of said additional pattern by an offset obtained by a method according to claim 1; and
  writing said additional pattern according to said adapted pattern definition.

17. A micro-lithographic printing device, comprising:
  a substrate support;
  a printing head;
  said printing head comprising illumination means for illuminating a substrate provided at said substrate support;
  said printing head further comprising an imaging device for measuring reflected light, reflected from different points of said substrate;
  said imaging device being further configured to create a reflection image from said measured reflected light;
  said illuminating means being configured for illuminating said substrate with a test pattern of light;
  said test pattern having areas with illumination and areas without illumination;
  said test pattern being predetermined, defined relative a test pattern origin point;
  said imaging device being further configured for determining a measured test pattern origin point corresponding to said test pattern origin point from features in said reflection image being associated with said test pattern;
  said imaging device being further configured for determining a measured target pattern origin point corresponding to a target pattern origin point from features in said reflection image being associated with a target pattern of said substrate;
  said target pattern presenting areas of at least two different light reflectivities;
  said target pattern being predetermined, defined relative to said target pattern origin point;
  said imaging device being further configured for calculating an offset between a measured position and a written position as the difference between on one hand a difference between said measured target pattern origin point and said measured test pattern origin point, and on the other hand a difference between said target pattern origin point and said test pattern origin point.

18. The micro-lithographic printing device according to claim 17, wherein both said target pattern and said test pattern have edges in at least two non-parallel directions, whereby said imaging device being configured for determining said measured test pattern origin point corresponding to said test pattern origin point from edge features in said reflection image being associated with edges of said test pattern, and whereby said imaging device being configured for determining said measured target pattern origin point corresponding to said target pattern origin point from edge features in said reflection image being associated with edges of said target pattern of said substrate.

19. The micro-lithographic printing device according to claim 17, wherein said printing head is sweeping with respect to said substrate support, whereby said printing head further comprises modulating means for modulating illuminating light from said printing head in time synchronized with said sweeping, and whereby said printing head further comprises a light detector configured for recording time fluctuations of reflected light, whereby said imaging device is configured to create said reflection image by use of said recorded time fluctuations of reflected light.

20. The micro-lithographic printing device according to claim 17, further comprising a pattern writing control unit, configured to provide printing data to said printing head, said printing data comprising a pattern definition of an additional pattern to be printed onto a previously patterned substrate, whereby said pattern writing control unit being configured for adapting said pattern definition according to said offset.

* * * * *